US008706059B2

(12) United States Patent
King et al.

(10) Patent No.: US 8,706,059 B2
(45) Date of Patent: Apr. 22, 2014

(54) METHOD OF SELECTING AND BROADCASTING OVER A TRANSMISSION FREQUENCY AND DEVICE FOR THE SAME

(71) Applicant: Belkin International, Inc., Los Angeles, CA (US)

(72) Inventors: Randy King, Rochester, NY (US); Scott Jackson, Rochester, NY (US); Jeong Lee, Buena Park, CA (US); Wesley Kung, Alhambra, CA (US); James Foo, San Marino, CA (US); Jerry Ngai-Chiu Wong, South Pasadena, CA (US); Kelly Ferdman, Los Angeles, CA (US); Vannin Gale, Anaheim, CA (US)

(73) Assignee: Belkin International, Inc., Playa Vista, CA (US)

( * ) Notice: Subject to any disclaimer, the term of this patent is extended or adjusted under 35 U.S.C. 154(b) by 0 days.

(21) Appl. No.: 13/936,088

(22) Filed: Jul. 5, 2013

(65) Prior Publication Data

US 2013/0295862 A1    Nov. 7, 2013

Related U.S. Application Data

(63) Continuation of application No. 12/171,202, filed on Jul. 10, 2008, now Pat. No. 8,509,695.

(60) Provisional application No. 60/959,092, filed on Jul. 10, 2007.

(51) Int. Cl.
*H04B 1/034* (2006.01)

(52) U.S. Cl.
USPC .................................. 455/99; 455/62; 455/69

(58) Field of Classification Search
USPC .......................................................... 455/99
See application file for complete search history.

(56) References Cited

U.S. PATENT DOCUMENTS

2003/0060219 A1*   3/2003   Parsiokas ....................... 455/501
2007/0142010 A1*   6/2007   Christopher ............... 455/161.1

* cited by examiner

*Primary Examiner* — David Bilodeau
(74) *Attorney, Agent, or Firm* — Bryan Cave LLP

(57) ABSTRACT

In some embodiments, a method of identifying at least one transmission frequency in a set of carrier frequencies can include: (a) determining a first signal strength for each carrier frequency in the set of carrier frequencies; (b) choosing a first transmission frequency from the set of carrier frequencies at least partially based on the first signal strength of each of the carrier frequencies of the set of carrier frequencies; and (c) broadcasting electrical signals over the first transmission frequency. Other embodiments are disclosed herein.

18 Claims, 11 Drawing Sheets

METHOD OF SELECTING AND BROADCASTING OVER A TRANSMISSION FREQUENCY AND DEVICE FOR THE SAME

CROSS-REFERENCE TO RELATED APPLICATIONS

This application claims is a divisional of U.S. patent application Ser. No. 12/171,202, filed Jul. 10, 2008, which claim priority to U.S. Provisional Patent Application No. 60/959,092, filed Jul. 10, 2007. U.S. patent application Ser. No. 12/171,202 and U.S. Provisional Patent Application No. 60/959,092 are incorporated herein by reference.

FIELD OF THE INVENTION

This invention relates generally to methods and devices for transmitting electrical signals, and relates more particularly to methods, devices, and systems for selecting a transmission frequency, and broadcasting the electrical signals over the transmission frequency or other frequencies.

DESCRIPTION OF THE BACKGROUND

With the increasing popularity of portable media players, people want to listen to music or other media stored in their portable media players while driving in their vehicles. In particular, people want to use their vehicle's radio and speaker system to listen to the music and other media stored in their portable media players. Most radios in vehicles, however, do not easily couple to portable media players. Instead, some vehicles have input connectors or cassette players to which the portable media players can be coupled.

In vehicles that do not have input connectors or cassette players, people have to find other ways of sending the audio signals from their portable media players to the vehicles' radio or speaker system. One common method involves coupling a portable media player to a transmitter, which wirelessly transmits the audio signals to the vehicle's radio over a carrier frequency.

While using a transmitter solves the problem of coupling the portable media player to the vehicle's radio and speaker system, it creates new problems and hazards for the driver of the vehicle. For example, a driver must find an unused carrier frequency over which to transmit the audio signals. Finding the unused frequency can be difficult and distracting to the driver. Because the vehicle is moving, the unused carrier frequencies are constantly changing as the vehicle moves in and out of range of different radio stations. Furthermore, tall buildings, hills, and any other large structures can temporarily block electrical signals on a carrier frequency and make a used carrier frequency seem empty for a short period of time. These factors can make finding an unused carrier frequency frustrating and potentially dangerous if a driver becomes distracted while trying to find an unused carrier frequency.

Accordingly, a need exists for an electrical device, system, and method that allows a person to easily find unused carrier frequencies for transmitting audio or other electrical signals.

BRIEF DESCRIPTION OF THE DRAWINGS

To facilitate further description of the embodiments, the following drawings are provided in which.

Figure 1:
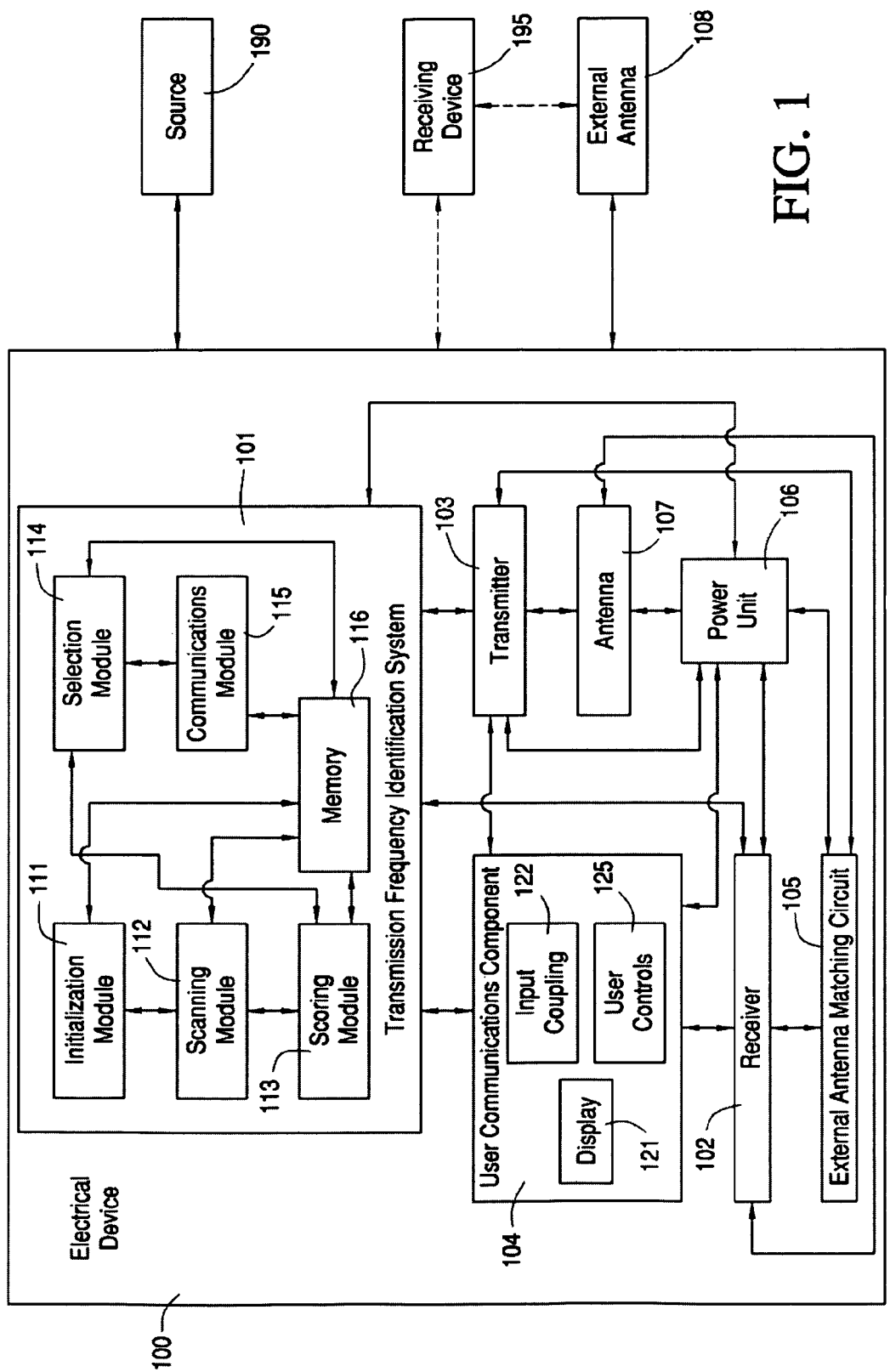
FIG. 1 is a block diagram illustrating an example of an electrical device configured to receive electrical signals from at least one source and to transmit the electrical signals to at least one receiving device, according to a first embodiment.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "include," and "have," and any variations thereof, are intended to cover a non-exclusive inclusion, such that a process, method, system, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein.

The terms "couple," "coupled," "couples," "coupling," and the like should be broadly understood and refer to connecting two or more elements or signals, electrically and/or mechanically, either directly or indirectly through intervening circuitry and/or elements. Two or more electrical elements may be electrically coupled, either direct or indirectly, but not be mechanically coupled; two or more mechanical elements may be mechanically coupled, either direct or indirectly, but not be electrically coupled; two or more electrical elements may be mechanically coupled, directly or indirectly, but not be electrically coupled. Coupling (whether only mechanical, only electrical, or both) may be for any length of time, e.g., permanent or semi-permanent or only for an instant.

"Electrical coupling" and the like should be broadly understood and include coupling involving any electrical signal, whether a power signal, a data signal, and/or other types or combinations of electrical signals. "Mechanical coupling" and the like should be broadly understood and include mechanical coupling of all types.

The absence of the word "removably," "removable," and the like near the word "coupled," and the like does not mean that the coupling, etc. in question is or is not removable.

As used herein, "vehicle" and the like should be broadly understood and refer to vehicles of all types and designs, including watercraft, aircraft (both lighter-than-air and heavier-than-air), automobiles, trucks, carriages, golf carts, motorcycles, etc.

DETAILED DESCRIPTION OF EXAMPLES OF EMBODIMENTS

In a number of embodiments, a method of identifying at least one transmission frequency in a set of carrier frequencies can include: (a) determining a first signal strength for each carrier frequency in the set of carrier frequencies; (b) choosing a first transmission frequency from the set of carrier frequencies at least partially based on the first signal strength of each of the carrier frequencies of the set of carrier frequencies; and (c) broadcasting electrical signals over the first transmission frequency.

In the same or different embodiments, a method of selecting one or more transmission frequencies from two more carrier frequencies can include: (a) identifying one or more first unused carrier frequencies from the two or more carrier frequencies; (b) determining first characteristics of one or more carrier frequencies adjacent to each one of the one or more first unused frequencies; (c) selecting a first transmission frequency of the one or more transmission frequencies from the one or more first unused frequencies at least partially based on the first characteristics of the one or more carrier frequencies adjacent to each one of the one or more first unused frequencies; and (d) broadcasting electrical signals over the first transmission frequency of the one or more transmission frequencies.

In various embodiments, a method of automatically selecting a transmission frequency from three or more potential carrier frequencies can include: (a) scanning the three or more potential carrier frequencies to determine a first signal strength indication of each of the three or more potential carrier frequencies; (b) rescanning the three or more potential carrier frequencies to determine a second signal strength indication of each of the three or more potential carrier frequencies; (c) choosing the transmission frequency from the three or more potential carrier frequencies at least partially based on the first signal strength indication and the second signal strength indication of each of the three or more potential carrier frequencies; and (d) transmitting electrical signals on the transmission frequency.

In many embodiments, a method of identifying a transmission frequency can include: (a) at a first location, identifying a first frequency as a first possible transmission frequency; (b) identifying the first frequency as the transmission frequency; (c) at a second location, automatically identifying a second frequency as a possible transmission frequency; and (d) identifying the second frequency as the transmission frequency.

Some embodiments concern a method of broadcasting one or more electrical signals from an electrical device. The method can include: (a) using the electrical device to select a first empty transmission frequency from the set of carrier frequencies; (b) using the electrical device to transmit identifying information for the first empty transmission frequency to the receiver over a second carrier frequency in the set of carrier frequencies; and (c) using the electrical device to transmit the one or more electrical signals over the first empty carrier frequency.

Numerous embodiments concern a method of broadcasting two or more electrical signals using a first electrical device. Each of the one or more electrical signals includes radio broadcast data system data on a subcarrier frequency. The method includes: (a) using the first electrical device to identify a first radio frequency from one or more radio frequencies in a first location at a first time using at least one of: (1) characteristics of at least two radio frequencies of the one or more radio frequencies; and (2) characteristics of one or more radio frequencies adjacent to each of the at least two radio frequencies of the one or more radio frequencies; (b) using the first electrical device to transmit identifying information for the first radio frequency as part of the radio broadcast data system data of at least a first electrical signal of the two or more electrical signals, the identifying information transmitted over a second radio frequency of the one or more radio frequencies; and (c) using the first electrical device to transmit at least a second electrical signal of the two or more electrical signals over the first radio frequency.

In some embodiments, an electrical device configured to select a transmission frequency from a set of carrier frequencies for a user can include: (a) a receiver; (b) a scanning module configured to measure a signal strength indication of each carrier frequency in the set of carrier frequencies; (c) a scoring module configured to determine at least one empty frequency based at least partially on the signal strength indication of each carrier frequency in the set of carrier frequencies; (d) a selection module configured to choose the transmission frequency from the at least one empty frequency; and (e) a transmitter configured to transmit electrical signals.

The same or different embodiments can also concern an electrical device configured to be coupled to a vehicle. The vehicle can have a power plug with a ground connector. The electrical device can include: (a) a connector comprising a ground electrode and configured to electrically couple to the vehicle; and (b) a transmitter electrically coupled to the connector and configured to transmit first electrical signals using the vehicle as a radio antenna. When the ground electrode of the connector is coupled to the ground connector of the power plug of the vehicle, the transmitter can be configured to use the vehicle as the radio antenna.

Various embodiments can concern a radio frequency receiving apparatus configured to couple to a cigarette lighter of a vehicle. The cigarette lighter can include a first terminal and a ground terminal with the ground terminal of the cigarette lighter electrically coupled to a body of the vehicle. The radio frequency receiving apparatus can include: (a) a cigarette lighter adapter can have: (1) a first contact configured to couple to the first terminal of the cigarette lighter when the cigarette lighter adapter is inserted into the cigarette lighter;

and (2) a second contact configured to couple to the ground terminal of the cigarette lighter when the cigarette lighter adapter is inserted into the cigarette lighter; and (c) a radio frequency receiver electrically coupled to the second contact of the cigarette lighter adapter such that the body of the vehicle acts as an antenna for the radio frequency receiver when the cigarette lighter adapter is inserted into the cigarette lighter.

Turning to the drawings, FIG. 1 is a block diagram of an example of an electrical device 100 configured to receive one or more electrical signals from at least one source 190 and to transmit the one or more electrical signals to at least one receiving device 195, according to a first embodiment. Electrical device 100 is merely exemplary and the invention is not limited to the specific embodiments or examples presented herein. Electrical device 100 can be employed in many different embodiments or examples not specifically depicted or described herein.

As an example, electrical device 100 can include: (a) transmission frequency identification system 101; (b) at least one receiver 102; (c) at least one transmitter 103; (d) a user communications component 104; (e) an external antenna matching circuit 105; (f) a power unit 106; and (g) at least one antenna 107. In some embodiments, electrical device 100 can be coupled (removably or otherwise) to an external antenna 108 in addition to or instead of antenna 107. In the same or different examples, user communications component 104 can include: (a) a display 121; (b) an input coupling 122; and (c) user controls 125.

Broadly speaking, and as explained in detail below, in some embodiments, electrical device 100 can be coupled to and receive audio and/or electrical signals from source 190 through input coupling 122. Before or while receiving audio and/or electrical signals from source 190, identification system 101 can identify a transmission frequency from a set of carrier frequencies. The transmission frequency can be a carrier frequency selected to ensure that the audio and/or other electrical signals from source 190 are transmitted over an unused or empty carrier frequency.

After selecting the transmission frequency, display 121 displays the transmission frequency to the user, and transmitter 103 begins transmitting the audio and/or other electrical signals over the transmission frequency using antenna 107 or external antenna 108. The user can turn the vehicle's radio to the displayed transmission frequency displayed by display 121 to receive the audio and/or other electrical signals. Accordingly, electrical device 100 allows a user to play audio and/or other electrical signals from source 190 through his vehicle's radio and speaker system without the distraction and frustration of trying to manually locate an unused or empty carrier frequency.

In some embodiments, source 190 is an electrical device configured to produce electrical signals. For example, source 190 can be a mobile (or cellular) phone, a laptop computer, an audio playback device, a portable AM (amplitude modulated) and FM (frequency modulated) radio, a satellite radio, a portable CD (compact disk) player, a data storage device, an audio player, an audio-visual player, and/or a portable MP3 (MPEG Audio Layer-3) player. In other embodiments, source 190 can be part of or integrally formed with electrical device 100. For example, electrical device 100 could include an MP3 player. Moreover, the electrical signals can be audio signals, video signals, data signals, or other types of electrical signals. The term "source 190" includes electronic devices of all types and designs, including, but not limited to, audio players and audio-visual media players. Receiving device 195 can be any electrical device that includes a receiver capable of receiving radio frequency (or other high frequency) signals. In some embodiments, receiving device 195 can be a radio or more specifically, a car radio.

In some examples, the set of carrier frequencies can include the full FM band. In the United States (US), the FM band includes the frequencies or channels between 87.5 MHz (megahertz) and 108 MHz. In Japan, the FM band includes frequencies between 76 MHz and 90 MHz. In Europe, the FM band includes frequencies between 87.6 MHz and 107.9 MHz. In other countries, the full FM band can scan other ranges of carrier frequencies.

In the United States, there is a 0.2 MHz spacing between adjacent carrier frequencies. That is, the set of carrier frequencies include the frequencies with a 0.2 MHz spacing (87.5 MHz, 87.7 MHz, 87.9 MHz, etc.) In Japan and Europe, the spacing between adjacent carrier frequencies is 0.1 MHz. In other embodiments, the set of carrier frequencies includes a subset of the full FM band. In further embodiments, the set of carrier frequencies include other carrier frequency sets or bands (e.g., the AM (amplitude modulated), the VHF (very high frequency), or the UHF (ultra high frequency) band).

Turning back to FIG. 1, display 121 can be used to provide information to the user of electrical device 100. In some examples, display 121 is a liquid crystal display (LCD) or indicator lights. Display 121 can be coupled to identification system 101 and configured to visually display the transmission frequency before and during transmission of electrical signals over the transmission frequency by transmitter 103.

Input coupling 122 can be configured to couple electrical device 100 to source 190. In some examples, input coupling 122 can receive electrical signals (e.g., audio or other media) from source 190. User communications component 104 can communicate the electrical signals to transmitter 103.

In the same or different embodiments, input coupling 122 can transfer communication, power, and audio signals between electrical device 100 and source 190. The type of input coupling 122 depends on the type of connector sources that electrical device 100 is designed to accept. For example, input coupling 122 can include a thirty-pin male serial connector configured to be plugged into and electrically coupled to an Apple® iPod® device. In another example, source 190 has a female USB (universal serial port) connector for coupling with external devices. In another example, input coupling 122 is a male USB connector.

User controls 125 allow the user to interact with and control electrical device 100. In some examples, user controls 125 can be configured to allow a user to select a new unused frequency. User controls 125 should be broadly understood to refer to any type of mechanism (with or without moving parts) with which the user can input information and/or instructions to electrical device 100. For example, user controls 125 can be a mechanical pushbutton, an electrostatic pushbutton, an electrostatic array, a voice activated component, a touch screen, or any other input component of any type.

Transmitter 103 can transmit electrical signals using antenna 107. In some examples, receiver 102 receives electrical signals using antenna 107. In other embodiments, electrical device 100 sends and/or receives electrical signals using external antenna 108.

To comply with FCC (Federal Communications Commission) and other regulatory body requirements, the output of transmitter 103 can be coupled to an attenuation circuit (not shown). The amount of attenuation that is needed to comply with FCC and other regulatory body requirements is dictated by the output of the particular transmitter the quality and type of antenna that is being utilized, and the environment in which transmitter 103 is being used. Consequently, the specific design of the attenuation circuit is a matter of design choice depending upon the needs of the particular application. For some types of electrical signals to be broadcast by transmitter 103, an attenuation circuit will not be needed. In some embodiments, the attenuation circuit can be a portion of external antenna matching circuit 105.

Identification system 101 can be configured to select a transmission frequency from a set of carrier frequencies. Identification system 101 can also be considered a system configured to identify at least one carrier frequency in a set of carrier frequencies for use with transmitter 103. That is, identification system 101 (or electrical device 100) can be a system for selecting a transmission frequency used to transmit an electrical signal from source 190 to receiving device 195. Identification system 101 is merely exemplary and the invention is not limited to the specific embodiments or examples presented herein. Identification system 101 can be employed in many different embodiments or examples not specifically depicted or described herein.

As an example, identification system 101 can include: (a) an initialization module 111 configured to initialize electrical device 100; (b) a scanning module 112 configured to measure a signal strength indication of each carrier frequency in the set of carrier frequencies; (c) a scoring module 113 configured to determine at least one empty frequency based at least partially on the signal strength indications of each carrier frequency in the set of carrier frequencies; (d) a selection module 114 configured to choose the transmission frequency from the at least one empty frequency; (e) a communications module 115 configured to communicate the transmission frequency to the user; and (f) memory 116.

In some embodiments, initialization module 111, scanning module 112, scoring module 113, a selection module 114, and communications module 115 can be implemented by program instructions stored in memory 116, and executed on a microprocessor (not shown), a microcontroller (not shown), or other electronic circuitry (not shown) in electrical device 100. In other examples, one or more of initialization module 111, scanning module 112, scoring module 113, selection module 114, and communications module 115 can be implement by logic circuitry in electrical device 100.

Memory 116 can store one or more data elements used by electrical device 100 or identification system 101. For example, memory 116 can store, among other things, one or more variables, values, arrays, or data elements related to the selection of a transmission frequency. In various examples, memory 116 can include Flash memory or RAM (random access memory).

Figure 2:
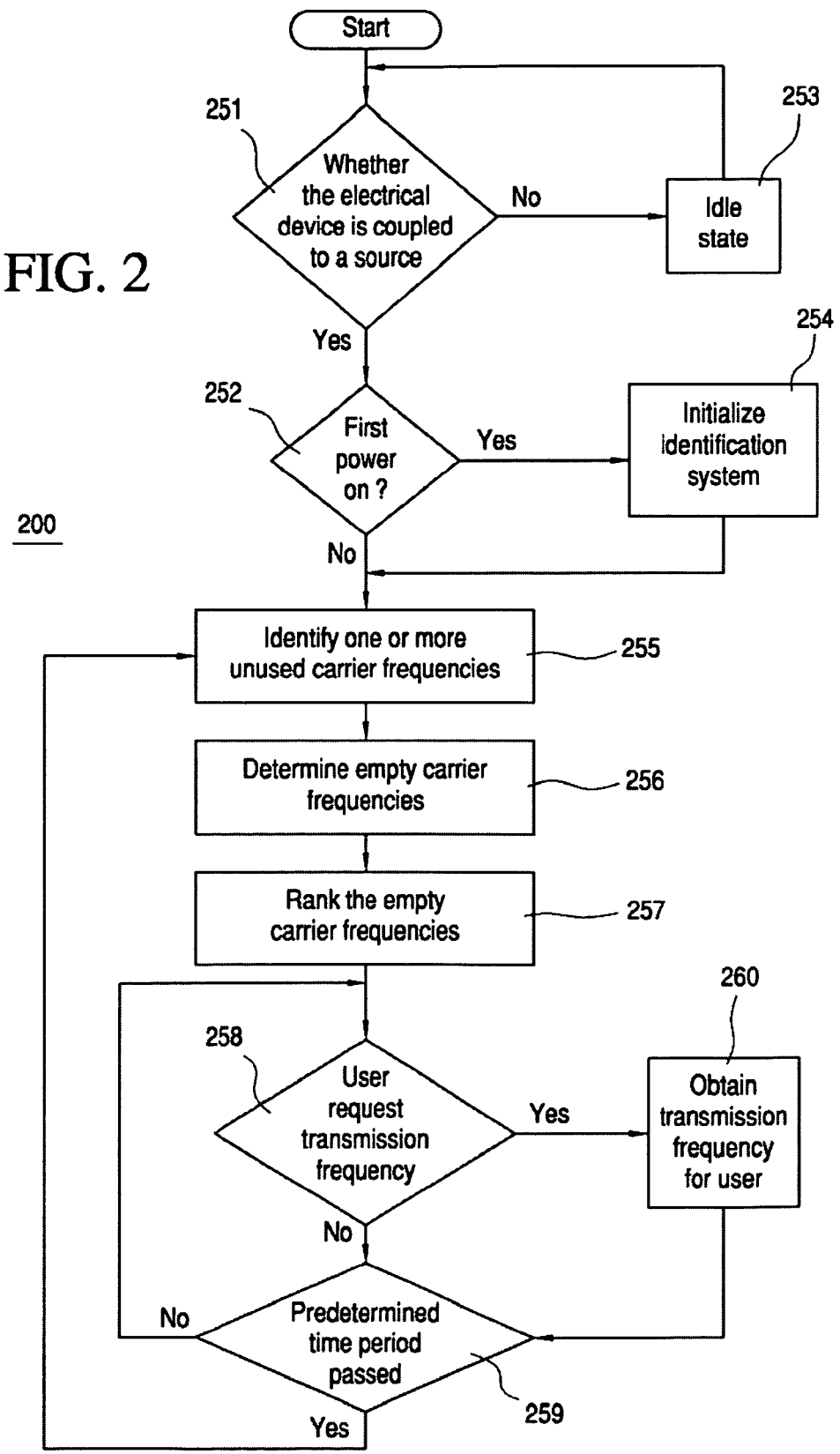
FIG. 2 is a flow chart illustrating an example of a method of identifying at least one transmission frequency from a set of carrier frequencies to use with the electrical device of FIG. 1, according to the first embodiment.

FIG. 2 is a flow chart illustrating an example of a method 200 of identifying at least one transmission frequency from the set of carrier frequencies to use with electrical device 100 (FIG. 1), according to the first embodiment. Method 200 or a portion thereof can also be considered a method for automatically selecting two or more transmission frequencies from three or more potential transmission frequencies. Method 200 or a portion thereof can further be considered a method of selecting a transmission frequency from two or more carrier frequencies. Method 200 is merely illustrative of a technique for implementing the various aspects of certain embodiments described herein, and electrical device 100 (FIG. 1) and method 200 are not limited to the particular embodiments described herein, as numerous other embodiments are possible.

In some examples, when electrical device 100 (FIG. 1) is running, program instructions, stored in memory 116 (FIG. 1), are executed by a microprocessor, a microcontroller, or other electronic circuitry. A portion of the program instructions can be suitable for carrying out the method of identifying at least one transmission frequency from the set of carrier frequencies with electrical device 100 (FIG. 1) as described below with respect to FIGS. 2-7. In other examples, method 200 or portions thereof can be implemented using by logic circuitry in electrical device 100.

In the example illustrated in FIG. 2, a first activity in method 200 is an activity 251 determining whether electrical device 100 (FIG. 1) is coupled to source 190 (FIG. 1). Referring again to the example shown in FIG. 1, initialization module 111 is configured to attempt to communicate with source 190 through input coupling 122, as part (not shown), antenna 107, or antenna 108. In some examples, a coupling with source 190 is detected by initialization module 111 when an initialization or handshaking routine with source 190 is initiated or completed.

Referring again to FIG. 2, if electrical device 100 (FIG. 1) is not coupled to source 190 (FIG. 1), the next activity in method 200 is an activity 253 of electrical device 100 (FIG. 1) going into an idle state. Electrical device 100 (FIG. 1) stays in the idle state until electrical device 100 (FIG. 1) detects a coupling to source 190 (FIG. 1). In one example, initialization module 111 (FIG. 1) can attempt to communicate with source 190 (FIG. 1) by repeating activity 251 at predetermined time intervals (e.g., two or five seconds) until a connection with source 190 (FIG. 1) is detected.

If electrical device 100 (FIG. 1) is coupled to source 190 (FIG. 1), the next activity in method 200 is an activity 252 of determining whether electrical device 100 (FIG. 1) is being powered on for the first time. In some examples, if electrical device 100 (FIG. 1) is being powered on for the first time, electrical device 100 (FIG. 1) might need to be initialized. In various embodiments, being powered on for the first time can include starting electrical device 100 (FIG. 1) for the first time or restarting electrical device 100 (FIG. 1) after electrical device 100 has been turned off or reset. In other examples, powered on for the first time includes only starting electrical device 100 (FIG. 1) for the first time after manufacturing or after a system reset.

If electrical device 100 (FIG. 1) is being powered on for the first time, the next activity in method 200 of FIG. 2 is an activity 254 of initializing identification system 101 (FIG. 1). In some examples, initializing identification system 101 (FIG. 1) includes setting one or more variables to predetermined values. For example, all the variables, grades, or ratings in a signal strength array can be set to one or more predetermined values (e.g., zero or −6 or −4).

The signal strength array is a list of the carrier frequencies in the set of carrier frequencies and a corresponding value, grade, or rating of the signal strength of the carrier frequencies. In one example, each of the carrier frequencies is assigned a weighted signal strength value of −6 to +5. In other examples, other valuing, grading, or rating systems of the signal strengths of the carrier frequencies can be used.

In some examples, a carrier frequency can be considered to have a signal on the carrier frequency or be a used channel if the signal strength value is between −3 and +5. A carrier frequency can be considered an unused and/or empty carrier frequency if the signal strength value is between −6 and −4. The range of signal strength values and what qualifies as an unused and/or empty carrier frequency can vary from the examples provided herein. In some examples, an RSSI (received signal strength indication) value for each carrier frequency is also stored in the signal strength array. The RSSI value is a measure of the strength of electrical signals on a carrier frequency.

Figure 3:
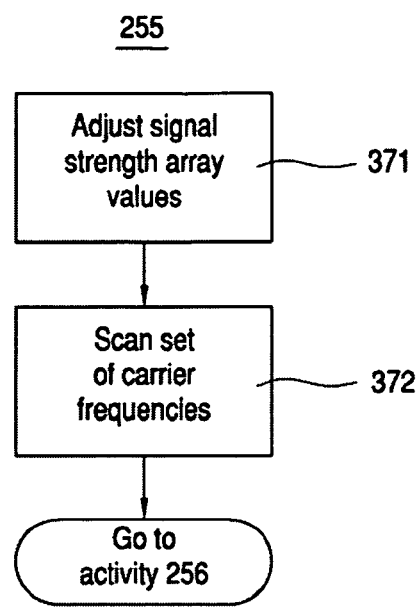
FIG. 3 is a flow chart illustrating an example of an activity of identifying one or more unused carrier frequencies in the set of carrier frequencies, according to the first embodiment.

Referring again to FIG. 2, the next activity in method 200 is an activity 255 of identifying one or more unused carrier frequencies in the set of carrier frequencies. FIG. 3 is a flow chart illustrating an example of activity 255 of identifying one or more unused carrier frequencies in the set of carrier frequencies, according to the first embodiment.

Referring to FIG. 3, the first procedure in activity 255 is a procedure 371 of adjusting the signal strength array values. In one example, each signal strength value in the signal strength array that is above a minimum value is decreased by one, and each signal strength value in the signal strength array that is less than or equal to the minimum value is not changed. For example, if the signal strength array value for one carrier frequency is −1 and if the minimum value is −3, the signal strength value is decreased to −2. In some examples, scanning module 112 (FIG. 1) can adjust the signal strength array values stored in memory 116 (FIG. 1).

Adjusting the signal strength values allows the results of previous attempts to identify unused carrier frequencies to be considered in determining unused carrier frequencies but with the results of previous attempts given a decreased weight. For the first attempt to identify unused frequencies, the signal strength array values are decreased one from the initial value. However, in subsequent iterations, the signal strength array values are not reset to the initial value and, instead, have values determined by the previous attempts. Accordingly, the results of previous attempts can affect the signal strength values stored in the signal strength array. In alternative embodiments, the signal strength values are reset to a predetermined default value at the beginning of each attempt to identify unused carrier frequencies, and the results of previous iterations do not affect the current results.

Figure 4:
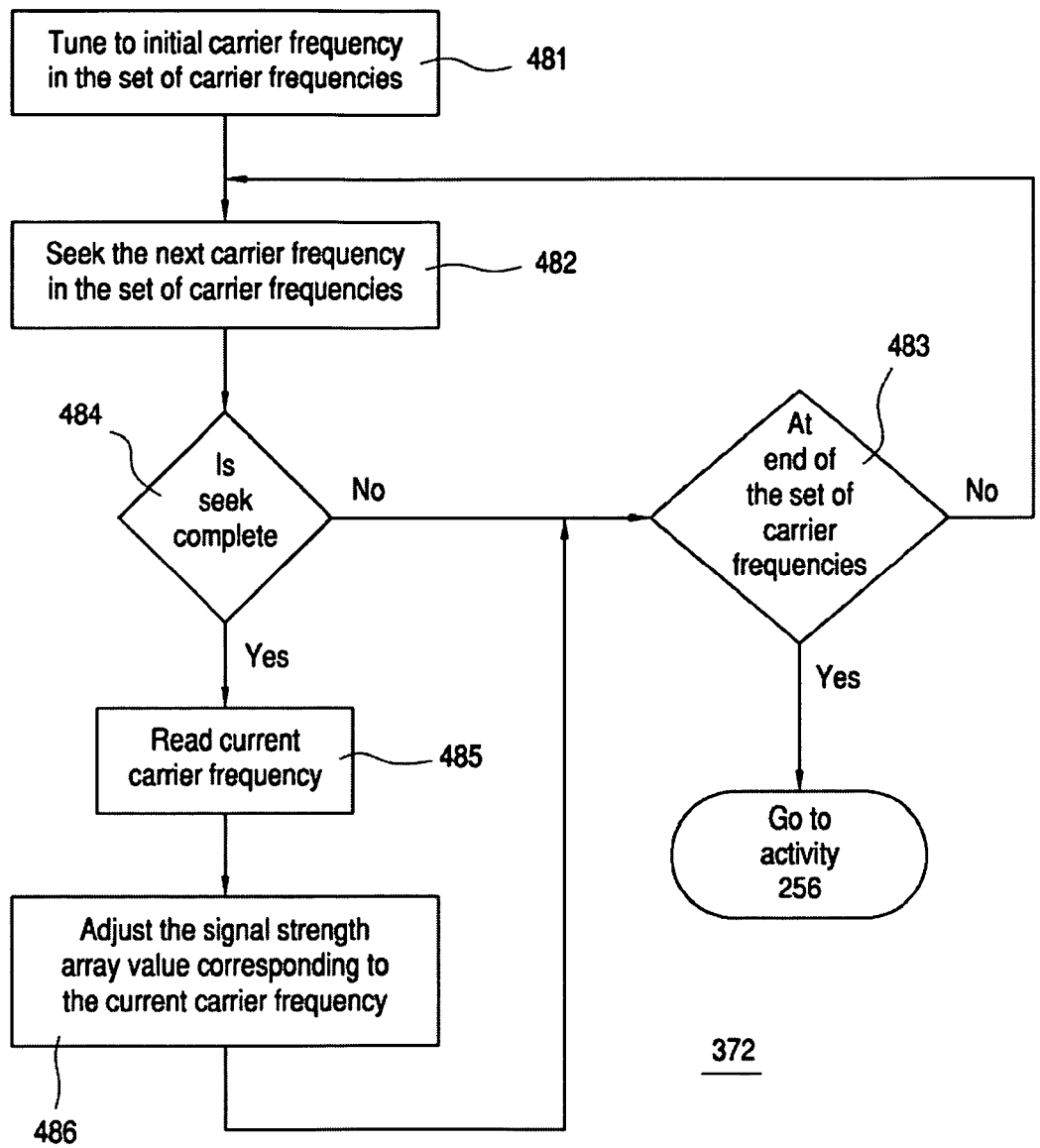
FIG. 4 is a flow chart illustrating an example of a procedure of scanning the set of carrier frequencies, according to the first embodiment.

Referring again to FIG. 3, the next procedure in activity 255 is a procedure 372 of scanning the set of carrier frequencies. In some embodiments, procedure 372 can be considered scanning the set of carrier frequencies for unused carrier frequencies. FIG. 4 is a flow chart illustrating an example of procedure 372 of scanning the set of carrier frequencies, according to the first embodiment.

Referring to FIG. 4, the first process in procedure 372 is a process 481 of tuning to an initial carrier frequency in the set of carrier frequencies. Referring back to FIG. 1, in some embodiments, scanning module 112 can instruct receiver 102 to tune to the highest carrier frequency in the set of carrier frequencies. When the set of carrier frequencies is the full United States FM band, scanning module 112 can instruct receiver 102 to tune to 107.9 MHz. In other embodiments, scanning module 112 can instruct receiver 102 to tune to the lowest carrier frequency or another predetermined carrier frequency. For example, the carrier frequency can be tuned to the frequency 0.2 MHz below the highest frequency when the set of carrier frequencies is the full United States FM band.

Referring again to FIG. 4, the next process in procedure 372 is a process 482 of seeking the next carrier frequency in the set of carrier frequencies. Seeking includes tuning receiver 102 (FIG. 1) to the next carrier frequency in the set of carrier frequencies and measuring the RSSI value. In some examples, receiver 102 (FIG. 1) measures the RSSI value for the carrier frequency. In some examples, the inverse RSSI value can be measured instead of the RSSI value. As appropriate herein, "RSSI value" refers to the RSSI value and/or the inverse RSSI value.

In some embodiments, if the scanning has just begun, receiver 102 (FIG. 1) is tuned to the second highest carrier frequency (e.g., 107.7 MHz in the US) in procedure 372, and the RSSI value at 107.7 MHz frequency is measured.

In the same or different embodiments, the RSSI value for the highest (or lowest) carrier frequency in the set of carrier frequency is not measured because the highest carrier frequency can be more prone to interference than other carrier frequencies. In alternative embodiments, receiver 102 can measure the RSSI value for the highest carrier frequency band in process 482.

The next process in procedure 372 is a process 484 of determining if the seeking is complete. Seeking is complete if the RSSI value measured in process 482 is greater than a predetermined value (e.g., the RSSI threshold). The RSSI threshold is the maximum value of signal strength acceptable on a carrier frequency for the carrier frequency to be considered useable, available, or empty. If the RSSI value is greater than the RSSI threshold for a carrier frequency, a radio station or another electrical device is probably already broadcasting on this carrier frequency, or a signal on an adjacent carrier frequency is bleeding into this carrier frequency. In some examples, the RSSI threshold can be 100 dBuV (decibels relative to 1 micovolt).

In some examples, receiver 102 (FIG. 1) determines if the RSSI value is greater than the RSSI threshold. In other examples, receiver 102 (FIG. 1) communicates the RSSI value to scanning module 112 (FIG. 1), and scanning module 112 (FIG. 1) determines if the value is greater than the RSSI threshold.

If seeking is complete (process 484), the next process in procedure 372 is a process 485 of reading the current carrier frequency. In one example, receiver 102 (FIG. 1) determines the current carrier frequency and communicates the carrier frequency to scanning module 112 (FIG. 1).

The next process in procedure 372 is a process 486 of adjusting the signal strength array value corresponding to the current carrier frequency. In some examples, process 486 can be considered providing a grade, value, or rating for the carrier frequency at least partially based on results of the scanning of the set of the carrier frequencies. In some embodiments, scanning module 112 (FIG. 1) can read the signal strength value for this carrier frequency from the array of signal strength values stored in memory 116 (FIG. 1) and adjust the signal strength value accordingly.

For example, as part of process 486, if the signal strength array value corresponding to the current carrier frequency is less than four, scanning module 112 (FIG. 1) can increase the signal strength value by two. If the corresponding signal strength value is equal to or greater than four, scanning module 112 (FIG. 1) can set the signal strength value equal to five. In other examples, scanning module 112 (FIG. 1) or other modules in identification system 101 (FIG. 1) can adjust the signal strength array values by other amounts.

The subsequent process in procedure 372 is process 483 of determining if the end of the set of carrier frequency has been reached. For example, the end of the set of carrier frequencies can be reached when receiver 102 (FIG. 1) and/or scanning module 112 (FIG. 1) has determined the RSSI value for every carrier frequency in the set of carrier frequencies. As another example, the end of the set of carrier frequencies is reached when receivers (102 (FIG. 1) and/or scanning module 112 (FIG. 1) reaches the lowest carrier frequency (e.g., 87.5 MHz). In some examples, receiver 102 (FIG. 1) determines if the end of the set of carrier frequencies is reached. In other examples, scanning module 112 (FIG. 1) determines if the end of the set of carrier frequencies has been reached.

If the end of the set of frequencies is reached, procedure 372 and activity 255 (FIG. 2) are complete, and the next is an activity 256 (FIG. 2). If the last carrier frequency has not been reached, processes 482 and 483 are repeated for the next carrier frequency. For example, in the United States, if the current frequency is 107.7 MHz, the next carrier frequency is 107.5 MHz. In a different embodiment, processes 481-486 can scan the frequencies from the lowest frequency to the highest frequency or using any predetermined order.

Returning to process 484, if seeking is not complete (i.e., the RSSI value is less than or equal to a predetermined value), then the signal strength array value for the current carrier frequency is not adjusted. Instead, process 483 is performed.

Figure 5:
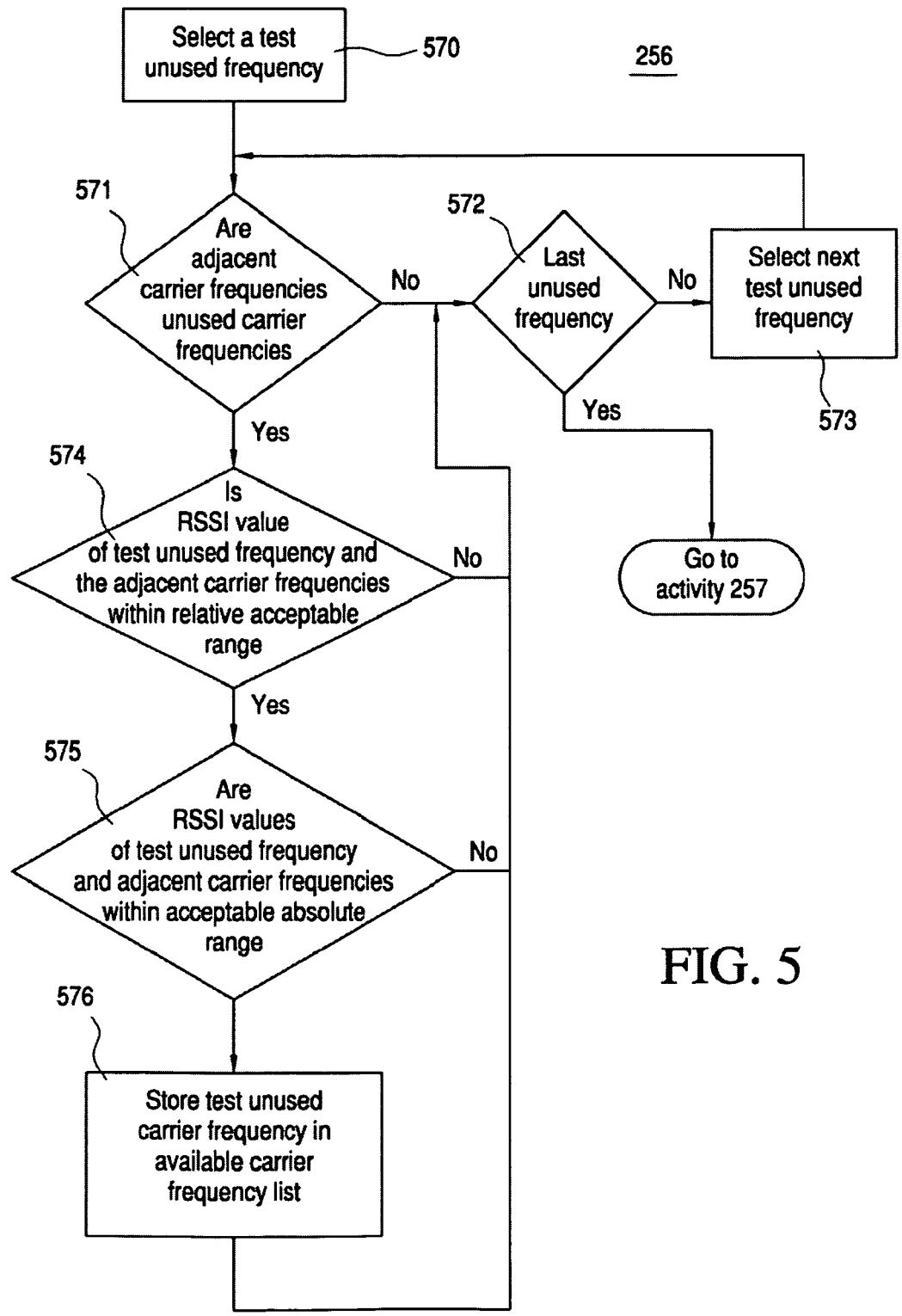
FIG. 5 is a flow chart illustrating an example of an activity of determining an empty carrier frequency, according to the first embodiment.

Referring again to FIG. 2, after activity 255 is complete, the next activity in method 200 is an activity 256 of determining the empty carrier frequencies. FIG. 5 is a flow chart illustrating an example of activity 256 of determining the empty carrier frequencies, according to the first embodiment.

Referring to FIG. 5, the first procedure in activity 256 is a procedure 570 of selecting a test unused frequency. In some embodiments, scoring module 113 (FIG. 1) can select the highest unused carrier frequency (e.g., 107.9 MHz) as the first test unused frequency. In some examples, the highest (or lowest) unused carrier frequency is disregarded because a higher adjacent frequency (e.g., 108.1 MHz) is not in the set of carrier frequencies and/or because the highest (or lowest) frequency is more prone to interference. In other examples, the highest (or lowest) unused frequency is treated the same as any other unused carrier frequencies. In subsequent selection procedures, test frequencies can be selected by checking each carrier frequency in a predetermined order whether the frequency is unused. For example, if the signal strength value for the carrier frequency is between −6 and −4, the carrier frequency can be considered an unused carrier frequency.

After selecting the test unused carrier frequency, the next procedure in activity 256 is a procedure 571 of determining if the carrier frequencies adjacent to the test unused frequency are also unused carrier frequencies. For example, if the test unused frequency is 107.1 MHz, scoring module 113 (FIG. 1) can determine whether 106.9 MHz and 107.3 MHz are unused frequencies. As mentioned above, in some embodiments, a carrier frequency is considered unused if the signal strength value for the carrier frequency is between −6 and −4. In some examples, scoring module 113 (FIG. 1) reads the signal strength value of the adjacent frequencies from memory 116 (FIG. 1).

If the adjacent frequencies are not unused frequencies, the next procedure in activity 256 is a procedure 572 of determining whether the test unused frequency is the last unused carrier frequency. If the test unused frequency is the last test unused frequency, activity 256 is complete, and the next activity is activity 257 (FIG. 2). In some embodiments, scoring module 113 (FIG. 7) determines if the test unused frequency is the last test unused carrier frequency by checking the signal strength to values in the signal strength array.

If the test unused carrier frequency is not the last unused carrier frequency, the next procedure in activity 256 is the procedure 573 of selecting the next test unused carrier frequency. After the next test unused carrier frequency is selected, the next procedure in activity 256 is procedure 571.

Returning to procedure 571, if the carrier frequencies adjacent to the test unused frequency are also unused carrier frequencies, the next procedure in activity 256 is a procedure 574 of determining if the RSSI value of the test unused frequency and adjacent frequencies are within an acceptable relative range. In one example, the RSSI value of the test unused frequency and the RSSI values of the adjacent carrier frequencies must be within a predetermined amount of each other. For example, if the test unused frequency has an RSSI equal to 25, if the adjacent carrier frequencies have RSSI equal to 5, and if the predetermined amount is equal to 10, the test unused frequency will be disqualified because the RSSI (25) of the test unused frequency is not within the predetermined amount (10) of the RSSI (5) of the adjacent carrier frequencies. If the RSSI of the adjacent frequencies were 23, instead 5, then the test unused frequency would be acceptable. This test is performed because the test unused frequency or the adjacent frequencies might not be a clear channel when compared to each other. That is, if an adjacent frequency has a relatively strong signal, this strong signal could bleed over to and interfere with the test unused carrier frequency.

In various examples scoring module 113 (FIG. 1) can determine if the RSSI value of the test unused frequency is within the acceptable relative range. In the same or different embodiments, if the RSSI value of the test unused frequency is not within an acceptable relative range, it is disqualified as a potential transmission frequency, and the next procedure in activity 256 is procedure 572.

If the RSSI value of the test unused frequency and the adjacent frequencies are within an acceptable relative range, the next procedure in activity 256 is a procedure 575 of determining whether the RSSI values of the test unused frequency and the adjacent frequencies are within an acceptable absolute range. For example, if the test unused frequency has an RSSI equal to 6, if the adjacent carrier frequencies have RSSI equal to 17 and 19, and if the predetermined maximum absolute RSSI value is equal to 10, the test unused carrier frequency will be disqualified because the RSSI (17 and 19) of the adjacent carrier frequencies is above the predetermined maximum absolute RSSI value (10). If the RSSI of the adjacent carrier frequencies was 10, the test unused frequency would be acceptable. This test is performed because the carrier frequency might be a clear channel when compared to the adjacent carrier frequencies but not when compared to an absolute RSSI value. In various examples, scoring module 113 (FIG. 1) can determine if the RSSI values of test unused frequency and adjacent carrier frequencies are within an acceptable range.

In some embodiments, the order of procedures 574 and 575 can be reversed or only one of procedures 574 and 575 can be performed.

If the RSSI values of adjacent carrier frequencies are not within an acceptable absolute range in procedure 575, the next procedure in activity 256 is procedure 572 of determining whether the test unused frequency is the last unused carrier frequency.

If the RSSI values of adjacent carrier frequencies are within an acceptable absolute range in procedure 575, the next procedure in activity 256 is a procedure 576 of storing the test unused frequency in an available frequency list. In various examples, scoring module 113 (FIG. 1) can save the test unused frequency into the available frequency list stored in memory 116 (FIG. 1). In some embodiments, the RSSI value for the test unused frequency is saved along with the test unused frequency in the available frequency list.

After storing the test unused frequency in the available frequency list, the next procedure in activity 256 is procedure 572 of determining whether the test unused frequency is the last unused carrier frequency. If the test unused carrier frequency is the last unused carrier frequency, activity 256 is complete, and the next activity is an activity 257 (FIG. 2).

Figure 6:
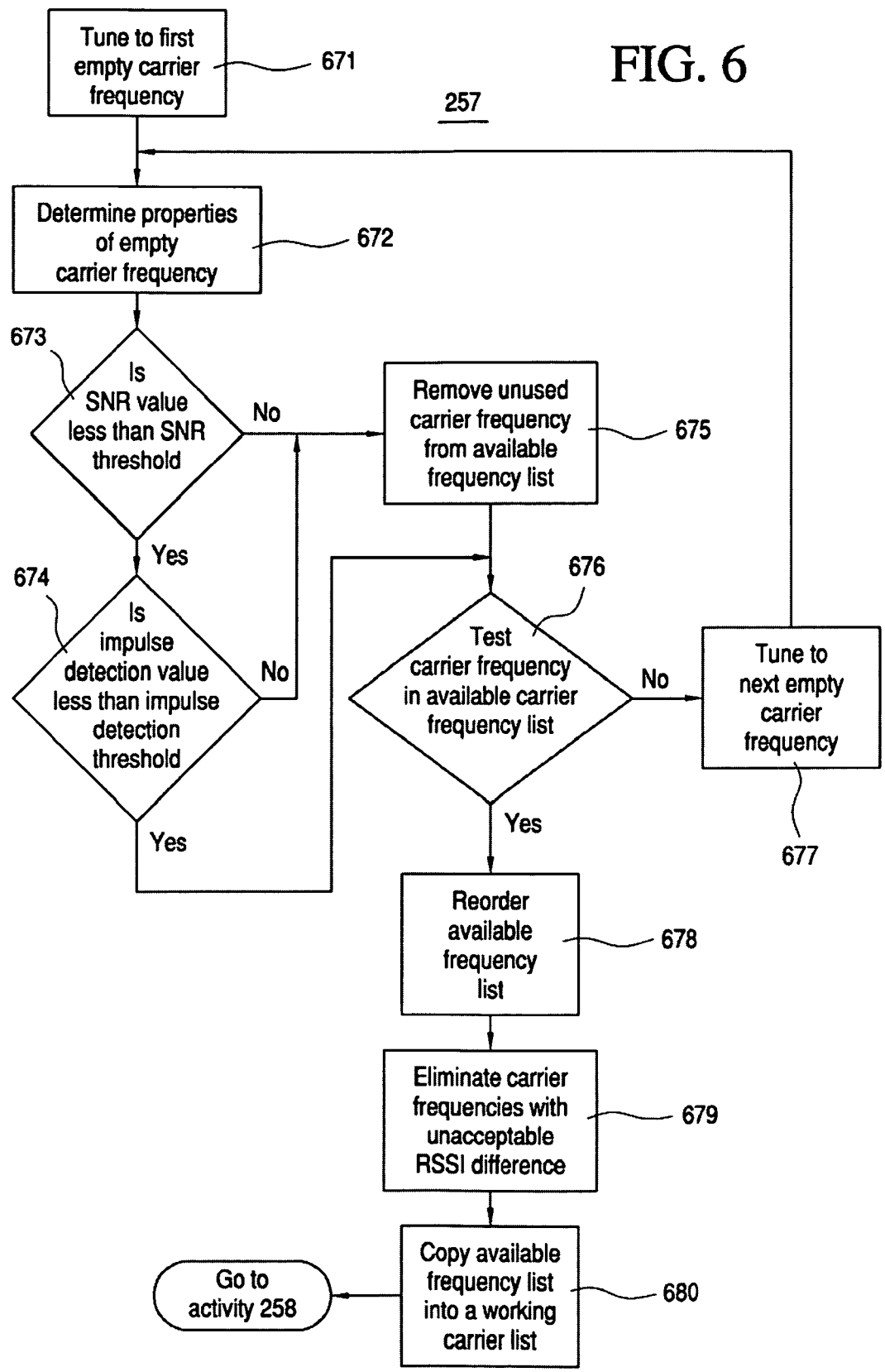
FIG. 6 is a flow chart illustrating an example of an activity of ranking the empty carrier frequencies, according to the first embodiment.

Referring again to FIG. 2, after activity 256 is complete, the next activity in method 200 is activity 257 of ranking the empty carrier frequencies. Ranking the frequencies helps ensure that a user is provided the clearest frequencies for use with electrical device 100 (FIG. 1). In yet other embodiments, activity 257 can be skipped, and the transmission frequency can be selected from the carrier frequencies in the available frequency list. FIG. 6 is a flow chart illustrating an example of activity 257 of ranking the empty carrier frequencies, according to the first embodiment.

Referring to FIG. 6, the first procedure in activity 257 is a procedure 671 of tuning to the first empty carrier frequency in the available carrier frequency list. In some examples, selection module 114 (FIG. 1) can instruct receiver 102 (FIG. 1) to tune into the first empty carrier frequency.

The next procedure in activity 257 is a procedure 672 of determining the properties of the empty carrier frequency. In one example, at least one of the RSSI value, the SNR (signal-to-noise ratio), and the impulse detection value for the empty carrier frequency can be measured. In some examples, receiver 102 (FIG. 1) can determine these values and communicate the properties to selection module 114 (FIG. 1). In other embodiments, one or more of these values were previously determined in process 482 (FIG. 4).

The SNR is the ratio of the signal power to the noise power corrupting the signal. That is, the SNR compares the level of the desired signal to the level of background noise. The higher the ratio, the less the background noise. Accordingly, the SNR threshold is the minimum value of the ratio of signal power to noise power that is acceptable on a carrier frequency for the carrier frequency to be considered useable, available, or empty.

Impulse noise can interfere with radio frequency signals and can render a radio frequency unusable. Accordingly, radio frequencies with lower impulse noise are better transmission frequencies. Impulse noise can be caused by various environmental factors including the ignition system of a vehicle or other DC (direct current) motors. Accordingly, the impulse detection threshold is the maximum value of impulse noise acceptable on a carrier frequency for the carrier frequency to be considered useable, available, or empty.

In some example, the SNR threshold can be set to one, and the impulse detection threshold can be set to zero. In other embodiments, other values or variables can be used.

After determining these value(s) in procedure 672, the next procedure in activity 257 is a procedure 673 of determining whether the SNR ratio is less than a SNR threshold. In some examples, selection module 114 (FIG. 1) can determine whether the SNR ratio is greater than the SNR threshold. If the SNR ratio is too high, the carrier frequency is unsuitable to use with electrical device 100 (FIG. 1).

If the SNR value is greater than the SNR threshold, the next procedure in activity 257 is a procedure 675 of removing the empty carrier frequency from the available carrier frequency list. In some examples, selection module 114 (FIG. 1) can remove the empty carrier frequency from the available carrier frequency list.

After removing the empty carrier frequency, the next procedure in activity 257 is a procedure 676 of determining whether the empty carrier frequency was the last carrier frequency in the available carrier frequency list. If the empty carrier frequency was not the last carrier frequency in the available carrier frequency list, the next procedure in activity 257 is procedure 677 of tuning to the next carrier frequency in the available carrier frequency list. After tuning to the next carrier frequency (procedure 677), the next procedure is procedure 672 of determining the properties of this next empty carrier frequency.

If the SNR ratio is less than the SNR threshold in procedure 673, the next procedure in activity 257 is procedure 674 of determining if the impulse detection value for the carrier frequency is less than the impulse detection threshold. In one example, selection module 114 (FIG. 1) can determine if the impulse detection value for the empty frequency is greater than the impulse detection threshold.

If the impulse detection value for the empty carrier frequency is greater than the impulse detection threshold, the next procedure in activity 257 is procedure 675 of removing the empty carrier frequency from the available carrier frequency list.

In other embodiments, the order of procedures 673 and 674 can be reversed, or only one of procedures 673 and 674 can be performed. In still other embodiments, one or both of procedures 673 and 674 can be performed as part of activity 256. In a further embodiment, both of procedures 673 and 674 can be omitted from activity 257, and instead, activity 257 can start with procedure 678.

If the impulse detection value for the empty carrier frequency is less than the impulse detection threshold, the next procedure in activity 257 is procedure 676 of determining whether the empty carrier frequency was the last carrier frequency in the available carrier frequency list. If the empty carrier frequency was not the last carrier frequency in the available carrier frequency list, the next procedure in activity 257 is procedure 677 of tuning to the next carrier frequency in the available carrier frequency list.

If the empty carrier frequency was the last carrier frequency in the available carrier frequency list, the next procedure in activity 257 is a procedure 678 of reordering the available carrier frequency list. In some examples, selection module 114 (FIG. 1) can reorder the available carrier frequency list in descending order of RSSI values. The available carrier frequencies can be reordered to ensure the clearest carrier frequency is provided first to the user.

After procedure 678, the next procedure in activity 257 is a procedure 679 of eliminating carrier frequencies with unacceptable RSSI differences from the available carrier frequency lists. In various embodiments, carrier frequencies with an RSSI value larger by more than a predetermined amount than the smallest RSSI value are removed from the list. For example, if the available carrier frequency list had five carrier frequencies, if their RSSI values are 2, 3, 5, 6 & 11, respectively, and if the predetermined amount is four, then the channel with RSSI equal to 11 will be eliminated from the array because the RSSI value (11) of that carrier frequency was larger than the smallest inverse RSSI value (2) by more than the predetermined amount (4). The other frequencies with RSSI values of 3, 5 and 6 are within the acceptable range and, accordingly, left in the available carrier frequency list, along with the frequency with the RSSI value of 2. This procedure will eliminate carrier frequencies that have either acceptable RSSI values when compared to adjacent carrier frequencies or acceptable absolute RSSI values, but are still unacceptable because their RSSI values are too large when compared to the RSSI values of other currently available carrier frequencies.

In some examples, selection module 114 (FIG. 1) can remove the carrier frequencies from the available carrier frequency list. In other embodiments, other criteria can be used to remove carrier frequencies with comparatively large RSSI values. For example, carrier frequencies with RSSI values larger than the average or median RSSI values for the carrier frequencies in the available carrier frequency list could be removed. In still other embodiments, procedure 679 is not performed.

After procedure 679, the next procedure in activity 257 is a procedure 680 of copying the available carrier frequency list into a working carrier frequency list. Use of a double buffer for the list of available carrier frequencies allows identification system 101 (FIG. 1) to update the list while keeping a list of values available for immediate use by the user. As a result of the double buffer system and running method 200 as a background task, a carrier frequency is always immediately available to the user after the initial configuration. In other embodiments, a double buffer system is not used, and only one list (i.e. the available carrier frequency list) is used.

After copying the available carrier frequency list, activity 257 is complete and the next activity in method 200 (FIG. 2) is an activity 258 (FIG. 2) of determining if the user has requested a transmission frequency. In one example, a user can use user controls 125 (FIG. 1) in user communications component 104 (FIG. 1) to request a transmission frequency. In one example, if the user requests a transmission frequency through user controls 125 (FIG. 1) (e.g., by pressing a button), user communications component 104 (FIG. 1) can communicate the request to communications module 115 (FIG. 1).

Figure 7:
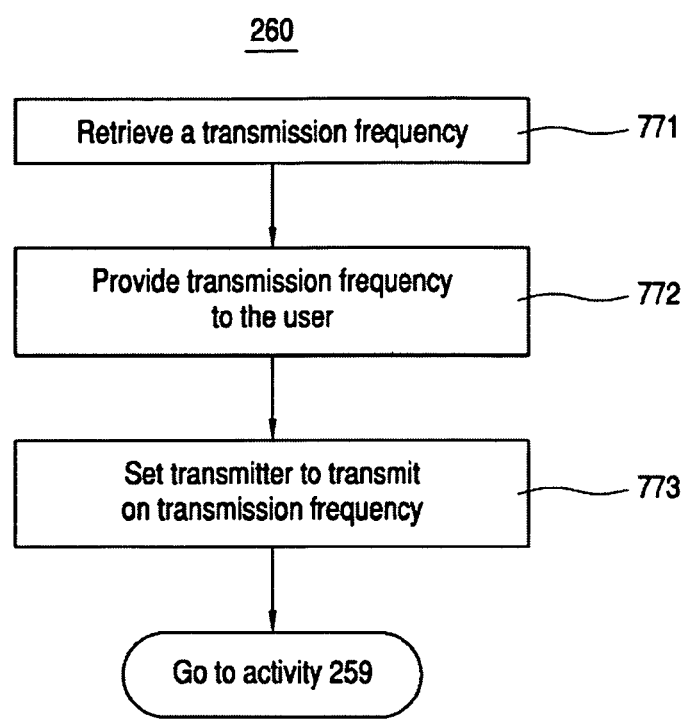
FIG. 7 is a flow chart illustrating an example of an activity of obtaining a transmission frequency for a user, according to the first embodiment.

Referring again to FIG. 2, if the user requests a transmission frequency, the next activity in method 200 is an activity 260 of obtaining a transmission frequency for the user. FIG. 7 is a flow chart illustrating an example of activity 260 of obtaining a transmission frequency for the user, according to the first embodiment.

Referring to FIG. 7, the first procedure in activity 260 is a procedure 771 of retrieving a transmission frequency from the working carrier frequency list. In some embodiments, if this request is the first request for a transmission frequency, the carrier frequency with the lowest RSSI value (i.e., the first carrier frequency in the working carrier frequency list) is retrieved. In some embodiments, the retrieved carrier frequency is the carrier frequency with the lowest RSSI value not previously used. In some examples, communications module 115 (FIG. 1) can retrieve the transmission frequency from the working carrier frequency list stored in memory 116 (FIG. 1).

After retrieving the transmission frequency, the next procedure in activity 260 is a procedure 772 of providing the transmission frequency to the user. Referring to FIG. 1, in some examples, communications module 115 can instruct user communications component 104 to display the transmission frequency to the user. The transmission frequency can be displayed by display 121. In these examples, after the transmission frequency is displayed by display 121, the user can manually tune the radio to the transmission frequency. In another embodiment, user communications component 104 can provide the transmission frequency in an audible form.

In other examples, other methods can be used to provide the transmission frequency to the user. For example, receiving device 195 can be automatically tuned to the transmission frequency. For example, FIG. 8 is a flow chart illustrating an example of procedure 772 of providing the transmission frequency to the user, according to an embodiment.

Figure 8:
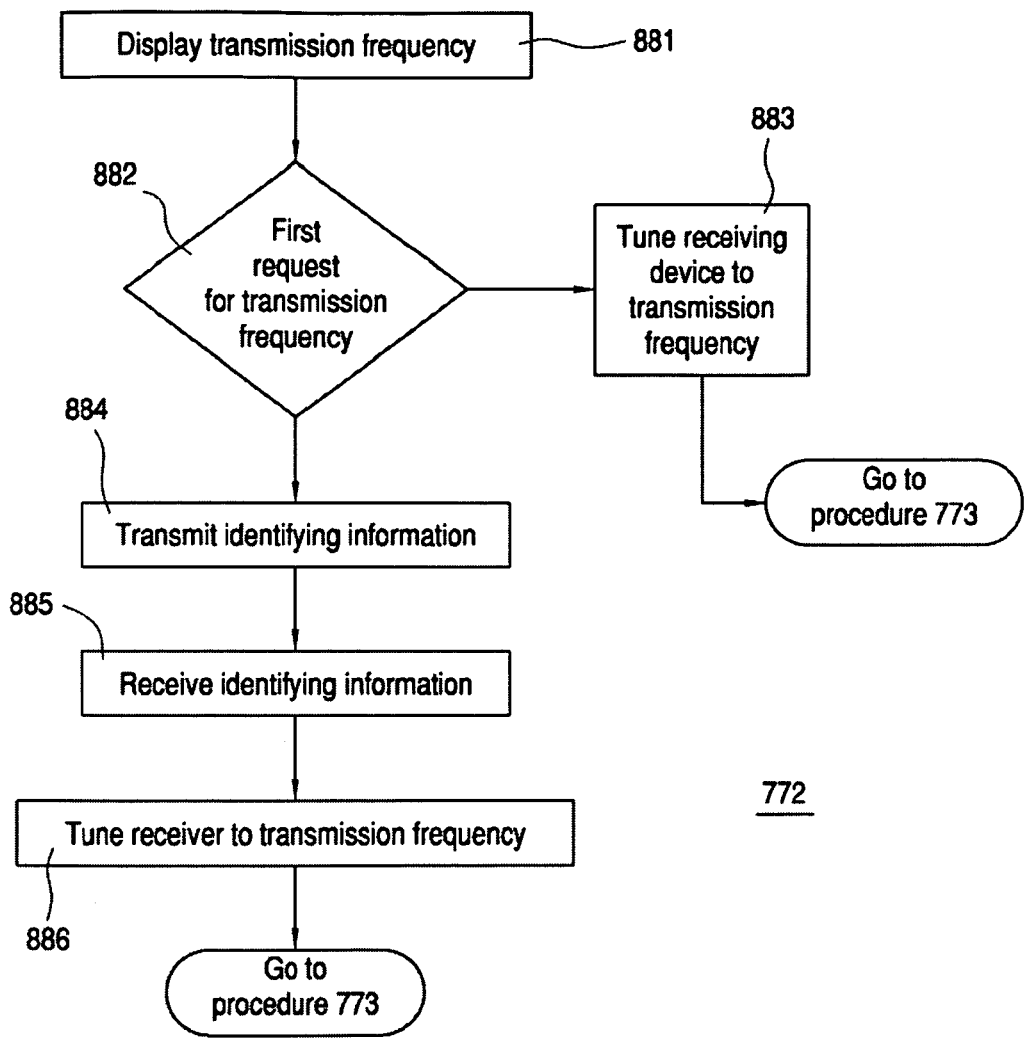
FIG. 8 is a flow chart illustrating an example of a procedure of providing the transmission frequency to a user, according to an embodiment.

Referring to FIG. 8, the first process in procedure 772 is a process 881 of displaying the transmission frequency. In some embodiments, user communications component 104 (FIG. 1) can display the transmission frequency to the user. The transmission frequency can be displayed by display 121 (FIG. 1).

A subsequent process in procedure 772 is a process 882 of deciding whether this request for a transmission frequency is the first request for a transmission frequency. In some embodiments, selection module 114 can determine if this request for a transmission frequency is the first request for a transmission frequency.

If this request is the first request for a transmission frequency, the next process in procedure 772 is a process 883 of tuning the receiving device to the transmission frequency. In some examples, the user manually tunes receiving device 195 (FIG. 1) to the transmission frequency. That is, the user of receiving device 195 (FIG. 1) can read the transmission frequency from display 121 (FIG. 1) and manually tune receiving device 195 (FIG. 1) to the transmission frequency.

If the request for a transmission frequency is not the first request for a transmission frequency, receiving device 195 (FIG. 1) can be automatically tuned to the transmission frequency in some examples. In these examples, the next process in procedure 772 is a process 884 of transmitting identifying information for the transmission frequency to a receiver or receiving device over a carrier frequency from the set of carrier frequencies. Referring again to FIG. 1, transmitter 103 can transmit identifying information (e.g., the call numbers of the transmission frequency) to receiving device 195.

In many examples, the identifying information can be transmitted from transmitter 103 to receiving device 195 over the old transmission frequency. That is, the user had previously requested a transmitting frequency before the current request. Transmitter 103 is currently broadcasting the electrical signal over this old transmission frequency. In this example, transmitter 103 transmits the identifying information over the old transmission frequency to receiving device 195.

In same or different examples, the identifying information is transmitted using a subcarrier frequency of a specific carrier frequency. A subcarrier frequency is a separate analog or digital signal carried on the carrier frequency, which can transmit extra information beyond the information transmitted by the main carrier frequency. In one example, the 57 KHz (kilohertz) subcarrier frequency of a standard FM frequency can be used to transmit the identifying information for the new transmission frequency.

In the same or different embodiments, the identifying information can be transmitted using the European Radio Data System standard or the United States' Radio Broadcast Data System standard (collectively, the "RDS standards"). The RDS Standards includes the European Radio Data System standard, the United States' Radio Broadcast Data System standard and any similar standards in other countries. RDS standards also include any subsequent, succeeding, or competing standards to the RDS standards.

The RDS standards are standards for sending small amounts of digital information in conventional FM radio broadcasts using a subcarrier frequency. In some versions of the RDS standards, the information transmitted includes AF (Alternative Frequency) information. Typically, the AF data includes information about alternative frequencies on which the current radio station can be heard. Conventionally, radios can use the AF data to tune the radio to the alternative frequency broadcasting the same content when the signal on the current carrier frequency gets too weak.

In some embodiments of process 884 of FIG. 8, instead of encoding information regarding other carrier frequencies broadcasting the same radio station in the AF data, communications module 115 (FIG. 1) can encode identifying information for the newly requested transmission frequency into the AF data of the old (i.e. current) transmission frequency After encoding the AF data with the transmission frequency, the electrical signal with AF data can be broadcast over the old (i.e., currently used) transmission frequency. In other embodiments, the AF data is encoded and transmitted over a different predetermined carrier frequency.

Referring still to FIG. 8, the next process in procedure 772 is a process 885 of receiving the identifying information using a receiver. In some embodiments, receiving device 195 is already tuned to the old transmission frequency and receives the identifying information encoded in the AF data for the old transmission frequency. In other examples, the identifying information can be encoded in the electrical signal transmitted by other methods, and receiving device 195 can be designed and programmed to receive the identifying information.

After receiving the identifying information, the subsequent process of procedure 772 is a process 886 of tuning the receiver to the transmission frequency. That is, receiving device 195 (FIG. 1) can automatically tune to the transmission frequency. In some embodiments, receiving device 195 (FIG. 1) has the AF option activated and, when the identifying information is received as part of the AF data, receiving device 195 (FIG. 1) automatically tunes the receiving device 195 (FIG. 1) to the transmission frequency. If the AF option is not activated, the user of receiving device 195 (FIG. 1) can manually tune receiving device 195 (FIG. 1) to the transmission frequency, in a manner similar or identical as to the process described in process 883.

After process 886 of FIG. 8, procedure 772 is complete and the next procedure in activity 260 is a procedure 773 of setting (e.g., tuning) a transmitter such as, for example, transmitter 103 (FIG. 1) to transmit on the transmission frequency. In some embodiments, transmitter 103 (FIG. 1) automatically begins to transmit on the transmission frequency after being set to transmit. In other examples, transmitter 103 (FIG. 1) waits a predetermined time (e.g., one or seven seconds) and then begins transmitting. In alternative embodiments, transmitter 103 (FIG. 1) waits for instructions from the user to begin transmitting. In some examples, communications module 115 (FIG. 1) can instruct transmitter 103 (FIG. 1) to begin transmitting on the transmission frequency. In different embodiments, procedure 773 (FIG. 7) can occur before procedure 772 (FIG. 7).

Referring again to FIG. 7, after providing the transmission frequency to the user in procedure 774, activity 260 can also mark the new current transmission frequency as used. In some examples, the working carrier frequency list allows the carrier frequencies to be mark as used. In some embodiments, if a carrier frequency is marked as used, this carrier frequency will not be provided to the user again. In a different embodiment, a carrier frequency from the working carrier frequency list will not be provided again to a user unless method 200 (FIG. 2) is repeated, beginning at activity 255 (FIG. 2), as explained hereafter. In some examples, communications module 115 (FIG. 1) can mark the transmission frequency as used. In other embodiments, marking the transmission frequency as used can be performed by removing the carrier frequency from the working carrier frequency list.

Referring again to FIG. 2, after procedure 774 (FIG. 7), activity 260 is complete, and the next activity in method 200 is an activity 259 of determining if a predetermined time period has passed. In various examples, the predetermined time is seven seconds. If the predetermined time has passed, the next activity in method 200 is activity 255 of identifying unused carrier frequencies. That is, if the predetermined time has passed, the activities needed to identify new or additional transmission frequencies or to confirm the usability of the carrier frequencies in the working carrier frequency list are repeated (i.e., activities 255 through 257).

To ensure a clear transmission frequency, it preferable to repeat activities 255 through 257 at regular intervals. If electrical device 100 (FIG. 1) is moving (e.g., in a vehicle), the carrier frequencies available for use are continuously changing. For example, if electrical device 100 (FIG. 1) was at the base of a tall building during the initial scan, the building could have blocked a strong signal on one or more carrier frequencies. As soon as electrical device 100 (FIG. 1) moves out of the shadow of the tall building, this carrier frequency would no longer be an acceptable frequency for transmission. Accordingly, updating the working carrier frequency list after a short predetermined time ensures that the best transmission frequency is presented to the user.

To one of ordinary skill in the art, it will be readily apparent that the device, system, apparatus, and method of use discussed herein may be implemented in a variety of embodiments, and that the foregoing discussion of certain of these embodiments does not necessarily represent a complete description of all possible embodiments. For example, identification system 101 (FIG. 1) does not have to use all the filtering criteria (e.g., procedures 574-575 (FIG. 5), 673-674 (FIG. 6), and 678-679 (FIG. 6)) discussed herein to choose a transmission frequency. In some embodiments, only a subset of the filtering criteria or other criteria can be used. For example, identification system 101 (FIG. 1) could only use the SNR ratio and/or the impulse detection value to filter out used carrier frequencies. In other embodiments, identification system 101 (FIG. 1) could only use the RSSI value (or inverse RSSI). In yet other embodiments, identification system 101 could ignore the RSSI values of adjacent carrier frequencies or use the SNR or impulse detection value for the adjacent carrier frequencies as filtering criteria.

In some embodiments, as previously explained, all of or a portion of method 200 can be considered a method to choose the at least one carrier frequency at least partially based upon the signal strength indication of the at least one of the one or more unused carrier frequencies. In the same or different embodiments, all or a portion of method 200 can be considered a method to select a transmission frequency from the at least one first frequency at least partially based on the characteristics of the carrier frequencies adjacent to each one of the at least one first frequency. Moreover, all of or a portion of method 200 can be considered a method to select at least one first frequency based on the ratings of the one or more carrier frequencies. Also, method 200 can be considered a method to choose a first transmission frequency of the one or more first potential carrier frequencies in the set of potential carrier frequencies at least partially based on a received signal strength indication of each of the one or more potential carrier frequencies and characteristics of neighboring frequencies of each of the one or more potential carrier frequencies.

Figure 9:
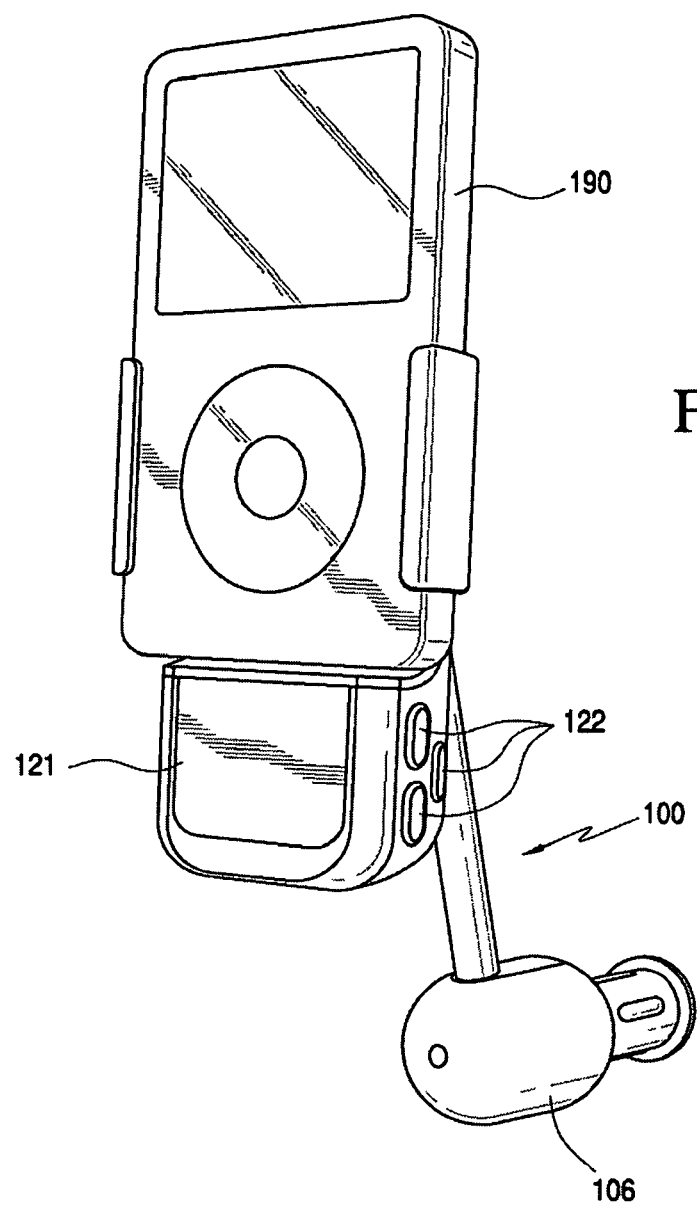
FIG. 9 is a front perspective representational view illustrating an example of the electrical device of FIG. 1 coupled to the source of FIG. 1, according to the first embodiment.
Figure 10:
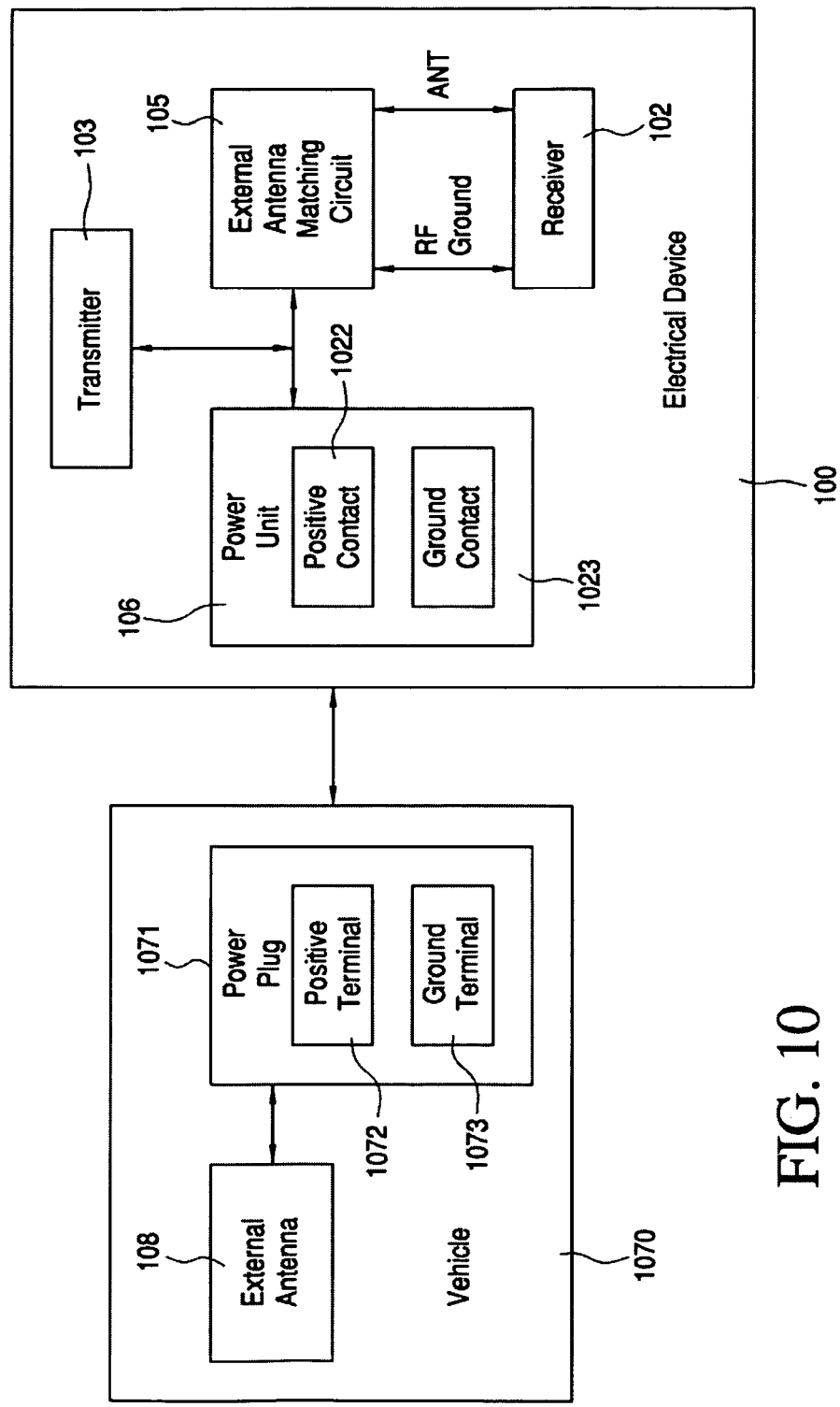
FIG. 10 is a block diagram illustrating an example of the coupling of a receiver of the electrical device of FIG. 1 to an external antenna, according to the first embodiment.
Figure 11:
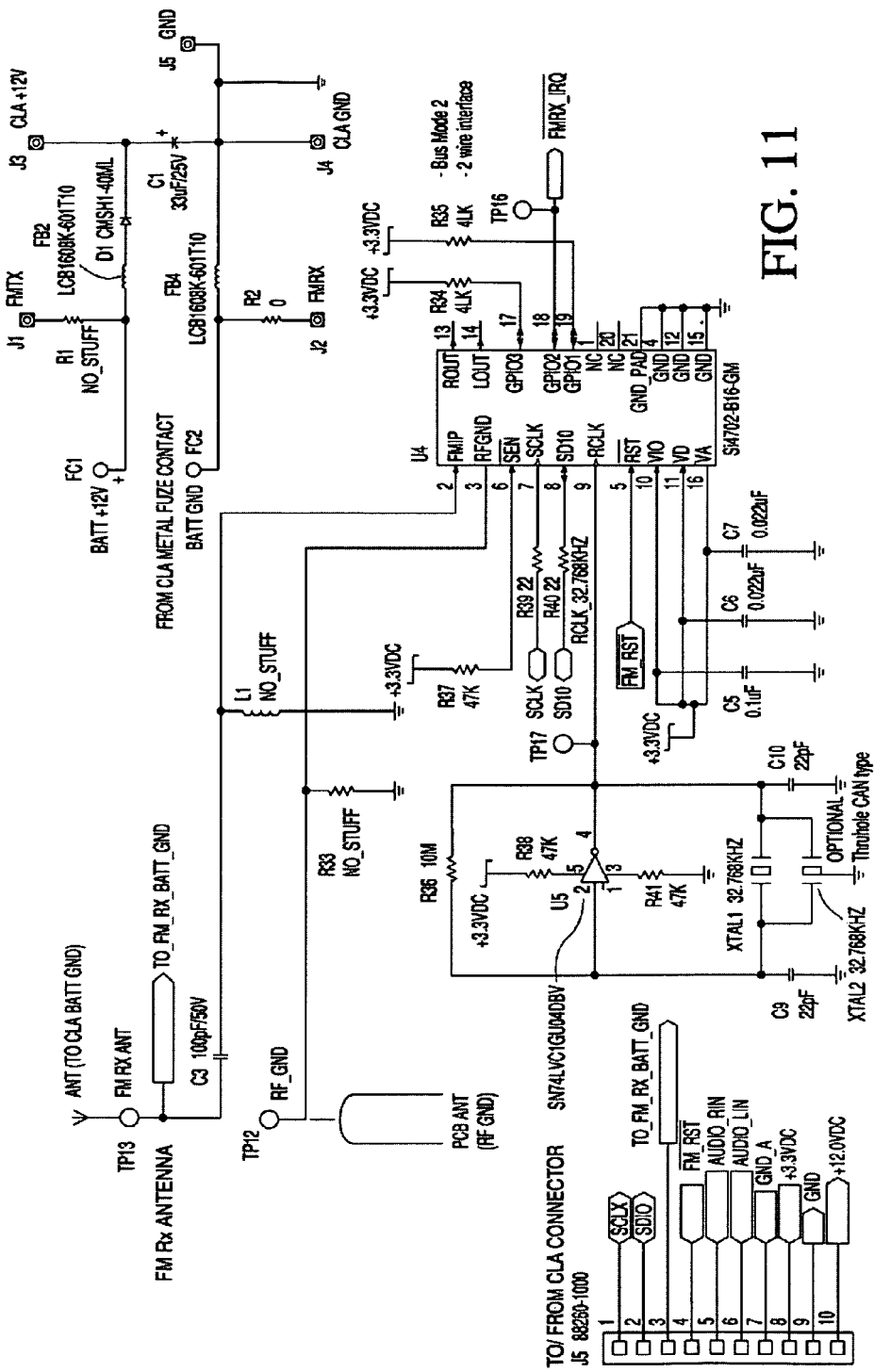
FIG. 11 is a circuit diagram illustrating an example of an external antenna matching circuit and other circuits in the electrical device of FIG. 1, according to the first embodiment.

FIG. 9 is a front perspective representational view illustrating an example of electrical device 100 coupled to source 190, according to the first embodiment. FIG. 10 is a block diagram illustrating an example of the coupling of receiver 102 to external antenna 108, according to the first embodiment. FIG. 11 is a circuit diagram illustrating an example of an external antenna matching circuit and other circuits in electrical device 100, according to the first embodiment.

In some examples, electrical device 100 can be considered a radio frequency receiving apparatus configured to couple to a cigarette lighter on a vehicle 1070 (FIG. 10). In the same or different embodiments, electrical device 100 can be considered an electrical device configured to be coupled to vehicle 1070.

In some examples, as illustrated in FIG. 10, vehicle 1070 can include: (a) external antenna 108; and (b) a power plug 1071. Power plug 1071 can include: (a) positive terminal 1072; and (b) a ground terminal 1073. In many vehicles, ground terminal 1073 of power plug 1071 is electrically coupled to the exterior body of the automobile. In various embodiments, power plug 1071 can be a cigarette lighter.

In various examples, external antenna 108 can include the exterior body of vehicle 1070. In the same or different embodiment, external antenna 108 can include the chassis of vehicle 1070. Usually vehicles have a separate antenna that protrudes from the vehicle that is used to receive FM signals for any attached radios, instead of using the exterior body of the vehicle as an antenna.

In various examples, power unit 106 (FIG. 1) can include: (a) a positive electrode or contact 1022 configured to couple to positive terminal 1072 when power unit 106 or a portion thereof is inserted into or otherwise coupled to power plug 1071; and (b) a ground electrode or contact 1023 configured to couple to the ground terminal 1073 when power unit 106 or a portion thereof is inserted into or otherwise coupled to power plug 1071. In some examples, power unit 106 can be or include a connector (e.g. cigarette lighter adapter) configured to couple to power plug 1071.

Receiver 102 (FIG. 1) is electrically coupled to external antenna matching circuit 105 (FIG. 1). External antenna matching circuit 105 (FIG. 1) can be electrically coupled between receiver 102 (FIG. 1) and vehicle 1070. In some examples, external antenna matching circuit 105 and transmitter 103 are electrically coupled to the ground contact 1023.

When ground contact 1023 is coupled to ground terminal 1073, transmitter 103 and/or receiver 102 are configured and coupled such that external antenna 108 (e.g., the body of the vehicle 1070) acts as the antenna for transmitter 103 and/or receiver 102. That is, in some embodiments, vehicle 1070 is used as a frequency modulated radio antenna for transmitter 103 and/or receiver 102.

Although the invention has been described with reference to specific embodiments, it will be understood by those skilled in the art that various changes may be made without departing from the spirit or scope of the invention. Additional examples of such changes have been given in the foregoing description. Accordingly, the disclosure of embodiments of the invention is intended to be illustrative of the scope of the invention and is not intended to be limiting.

It is intended that the scope of the invention shall be limited only to the extent required by the appended claims. Rather, the detailed description of the drawings, and the drawings themselves, disclose at least one preferred embodiment of the invention, and may disclose alternative embodiments of the invention.

All elements claimed in any particular claim are essential to the invention claimed in that particular claim. Consequently, replacement of one or more claimed elements constitutes reconstruction and not repair. Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A method of automatically selecting one or more transmission frequencies from five or more potential carrier frequencies, the method comprising:
    scanning the five or more potential carrier frequencies to determine a first signal strength indication of each of the five or more potential carrier frequencies; storing the first signal strength indication of each of the five or more potential carrier frequencies in memory;
    rescanning the five or more potential carrier frequencies to determine a second signal strength indication of each of the five or more potential carrier frequencies; choosing a first transmission frequency from the five or more potential carrier frequencies at least partially based on the first signal strength indication and the second signal strength indication of each of the five or more potential carrier frequencies;
    before choosing the first transmission frequency, removing a potential carrier frequency from the five or more potential carrier frequencies based on characteristics of one or more carrier frequencies adjacent to the potential carrier frequency of the five or more potential carrier frequencies;
    transmitting electrical signals on the first transmission frequency,
wherein: the one or more transmission frequencies comprise the first transmission frequency;
further comprising:
    after choosing the first transmission frequency, storing the second signal strength indication of each of the five or more potential carrier frequencies in the memory;
    rescanning the five or more potential carrier frequencies to determine a third signal strength indication of each of the five or more potential carrier frequencies;
    choosing a second transmission frequency from the five or more potential carrier frequencies at least partially based on the first signal strength indication, the second signal strength indication, and the third signal strength indication of each of the five or more potential carrier frequencies; and
transmitting electrical signals on the second transmission frequency.

2. The method of claim 1, wherein:
rescanning the five or more potential carrier frequencies occurs automatically at a predetermined time period after scanning the five or more potential carrier frequencies.

3. The method of claim 1, wherein:
storing the first signal strength indication of each of the five or more potential carrier frequencies comprises:
    determining a first signal strength score for each of the five or more potential carrier frequencies using the first signal strength indication of each of the five or more potential carrier frequencies and a previous signal strength score of each of the five or more potential carrier frequencies; and
choosing the first transmission frequency comprises:
    determining a second signal strength score for each of the five or more potential carrier frequencies using the second signal strength indication of each of the five or more potential carrier frequencies and the first signal strength score of each of the five or more potential carrier frequencies; and
    choosing the first transmission frequency from the five or more potential carrier frequencies at least partially based on the second signal strength score for each of the five or more potential carrier frequencies.

4. The method of claim 1, further comprising:
tuning a transmitter to the first transmission frequency.

5. The method of claim 1, further comprising:
providing the first transmission frequency to a user by visually displaying the first transmission frequency to the user.

6. The method of claim 1, wherein:
providing the first transmission frequency comprises:

transmitting the first transmission frequency to a radio frequency receiver; and
automatically tuning the radio frequency receiver to the first transmission frequency.

7. The method of claim 1, further comprising:
encoding identifying information regarding the first transmission frequency into an alternative frequency portion of radio broadcast data system data of a second carrier frequency.

8. The method of claim 7, further comprising:
using a first electrical device to transmit the identifying information.

9. The method of claim 8, wherein:
using the first electrical device to transmit the identifying information comprises:
using the first electrical device to transmit the identifying information over the alternative frequency portion of the radio broadcast data system data of the second carrier frequency.

10. The method of claim 1, further comprising:
using the first electrical device to transmit identifying information for the first transmission frequency over a subcarrier frequency of a second carrier frequency.

11. The method of claim 10, further comprising:
receiving the identifying information using a receiver;
automatically tuning the receiver to the first transmission frequency after receiving the identifying information; and
using the receiver to receive the electrical signals broadcast over the first transmission frequency.

12. The method of claim 10, further comprising:
using the first electrical device to transmit the identifying information before transmitting the electrical signals on the first transmission frequency.

13. A method of automatically selecting two or more transmission frequencies from five or more potential carrier frequencies, the method comprising:
scanning the five or more potential carrier frequencies to determine a first signal strength indication of each of the five or more potential carrier frequencies;
determining a first signal strength score for each of the five or more potential carrier frequencies using at least the first signal strength indication of each of the five or more potential carrier frequencies and a previous signal strength score of each of the five or more potential carrier frequencies;
storing the first signal strength score of each of the five or more potential carrier frequencies in memory;
selecting a first transmission frequency from the five or more potential carrier frequencies at least partially based on the first signal strength indication of each of the five or more potential carrier frequencies;
broadcasting electrical signals over the first transmission frequency;
rescanning the five or more potential carrier frequencies to determine a second signal strength indication of each of the five or more potential carrier frequencies;
determining a second signal strength score for each of the five or more potential carrier frequencies using the second signal strength indication of each of the five or more potential carrier frequencies and the first signal strength score of each of the five or more potential carrier frequencies;
storing the second signal strength score of each of the five or more potential carrier frequencies in the memory;
selecting a second transmission frequency from the five or more potential carrier frequencies at least partially based on the second signal strength score for each of the five or more potential carrier frequencies; and
broadcasting the electrical signals over the second transmission frequency,
wherein:
the two or more transmission frequencies comprise the first transmission frequency and the second transmission frequency.

14. The method of claim 13, further comprising:
determining one or more default signal strength scores for each of the five or more potential carrier frequencies,
wherein:
the previous signal strength score of each of the five or more potential carrier frequencies comprises the one or more default signal strength scores for each of the five or more potential carrier frequencies.

15. The method of claim 13, further comprising:
rescanning the five or more potential carrier frequencies to determine a third signal strength indication of each of the five or more potential carrier frequencies;
determining a third signal strength score for each of the five or more potential carrier frequencies using the third signal strength indication of each of the five or more potential carrier frequencies and the second signal strength score of each of the five or more potential carrier frequencies;
storing the third signal strength score of each of the five or more potential carrier frequencies in the memory;
selecting a third transmission frequency from the five or more potential carrier frequencies at least partially based on the third signal strength score for each of the five or more potential carrier frequencies; and
broadcasting the electrical signals over the third transmission frequency,
wherein:
the two or more transmission frequencies further comprise the third transmission frequency.

16. The method of claim 13, further comprising:
providing the first transmission frequency to a user by visually displaying the first transmission frequency to the user.

17. The method of claim 13, further comprising:
encoding identifying information regarding the first transmission frequency into an alternative frequency portion of radio broadcast data system data of a second carrier frequency; and
using a first electrical device to transmit the identifying information regarding the first transmission frequency over a subcarrier frequency of the second carrier frequency.

18. A method of automatically selecting two or more transmission frequencies from five or more potential carrier frequencies, the method comprising:
measuring a first signal strength indication for the five or more potential carrier frequencies at a first time;
determining a first signal strength score for each of the five or more potential carrier frequencies at least partially based upon the first signal strength indication for the five or more potential carrier frequencies at the first time;
storing information related to the first signal strength indication for each of the five or more potential carrier frequencies;
selecting a first transmission frequency from the five or more potential carrier frequencies using at least in part the first signal strength indication for the five or more potential carrier frequencies at the first time;

broadcasting electrical signals over the first transmission frequency of the two or more transmission frequencies;

measuring a second signal strength indication for each of the five or more potential carrier frequencies at a second time;

determining a second signal strength score for each of the five or more potential carrier frequencies at least partially based upon the second signal strength indication of each of the five or more potential carrier frequencies at the second time and the first signal strength score for the five or more potential carrier frequencies;

storing information related to the second signal strength indication for each of the five or more potential carrier frequencies;

selecting a second transmission frequency from the five or more potential carrier frequencies using at least in part the second signal strength indication for the five or more potential carrier frequencies at the second time; and broadcasting the electrical signals over the second transmission frequency of the two or more transmission frequencies, wherein:

the first time is different from the second time.

* * * * *